(12) United States Patent
Watanabe et al.

(10) Patent No.: US 7,875,896 B2
(45) Date of Patent: *Jan. 25, 2011

(54) TRANSPARENT POSITIVE ELECTRODE

(75) Inventors: Munetaka Watanabe, Ichihara (JP); Noritaka Muraki, Ichihara (JP); Koji Kamei, Ichihara (JP); Yasushi Ohno, Ichihara (JP)

(73) Assignee: Showa Denko K.K., Tokyo (JP)

( * ) Notice: Subject to any disclaimer, the term of this patent is extended or adjusted under 35 U.S.C. 154(b) by 61 days.

This patent is subject to a terminal disclaimer.

(21) Appl. No.: 10/593,288

(22) PCT Filed: Apr. 28, 2005

(86) PCT No.: PCT/JP2005/008561

§ 371 (c)(1),
(2), (4) Date: Sep. 18, 2006

(87) PCT Pub. No.: WO2005/106983

PCT Pub. Date: Nov. 10, 2005

(65) Prior Publication Data

US 2007/0200129 A1 Aug. 30, 2007

Related U.S. Application Data

(60) Provisional application No. 60/570,136, filed on May 12, 2004.

(30) Foreign Application Priority Data

Apr. 28, 2004 (JP) .............................. 2004-134648

(51) Int. Cl.
*H01L 33/00* (2010.01)
(52) U.S. Cl. ....................................... 257/99; 257/103

(58) Field of Classification Search .................. 257/59, 257/72, 257, 290
See application file for complete search history.

(56) References Cited

U.S. PATENT DOCUMENTS

| | | | | |
|---|---|---|---|---|
| 5,977,566 | A * | 11/1999 | Okazaki et al. | 257/99 |
| 6,100,545 | A * | 8/2000 | Chiyo et al. | 257/98 |
| 6,242,761 | B1 * | 6/2001 | Fujimoto et al. | 257/94 |
| 6,331,450 | B1 * | 12/2001 | Uemura | 438/114 |
| 6,642,549 | B2 * | 11/2003 | Chen et al. | 257/99 |
| 6,670,647 | B1 * | 12/2003 | Yamasaki et al. | 257/99 |
| 6,861,663 | B2 * | 3/2005 | Sawazaki et al. | 257/13 |
| 6,958,494 | B2 * | 10/2005 | Lin et al. | 257/86 |

(Continued)

FOREIGN PATENT DOCUMENTS

JP 09-129932 A 5/1997

(Continued)

*Primary Examiner*—Wai-Sing Louie
*Assistant Examiner*—Bilkis Jahan
(74) *Attorney, Agent, or Firm*—Sughrue Mion, PLLC

(57) ABSTRACT

An object of the present invention is to provide a positive electrode having high transparency, low contact resistance and excellent current diffusibility and not requiring electron beam irradiation, high-temperature annealing or heat treatment, for alloying, in an oxygen atmosphere.

The inventive transparent positive electrode for gallium nitride-based compound semiconductor light-emitting devices comprises a contact metal layer in contact with a p-type semiconductor layer, a current diffusing layer on the contact metal layer, the current diffusing layer having an electrical conductivity larger than that of the contact metal layer, and a bonding pad layer on the current diffusing layer.

10 Claims, 2 Drawing Sheets

U.S. PATENT DOCUMENTS

| | | | |
|---|---|---|---|
| 2002/0072204 A1* | 6/2002 | Uemura et al. | 438/483 |
| 2002/0104999 A1* | 8/2002 | Nakajima et al. | 257/79 |
| 2002/0190263 A1 | 12/2002 | Hata et al. | |
| 2004/0124422 A1* | 7/2004 | Sakamoto et al. | 257/79 |
| 2008/0042159 A1* | 2/2008 | Eitoh et al. | 257/103 |

FOREIGN PATENT DOCUMENTS

| | | |
|---|---|---|
| JP | 10-256184 A | 9/1998 |
| JP | 11-40854 A | 2/1999 |
| JP | 2001-217456 A | 8/2001 |
| JP | 2002-164575 A | 6/2002 |
| JP | 2003-046127 A | 2/2003 |
| JP | 2003-133590 A | 5/2003 |
| JP | 2003-142732 A | 5/2003 |
| JP | 2004-111493 A | 4/2004 |

* cited by examiner

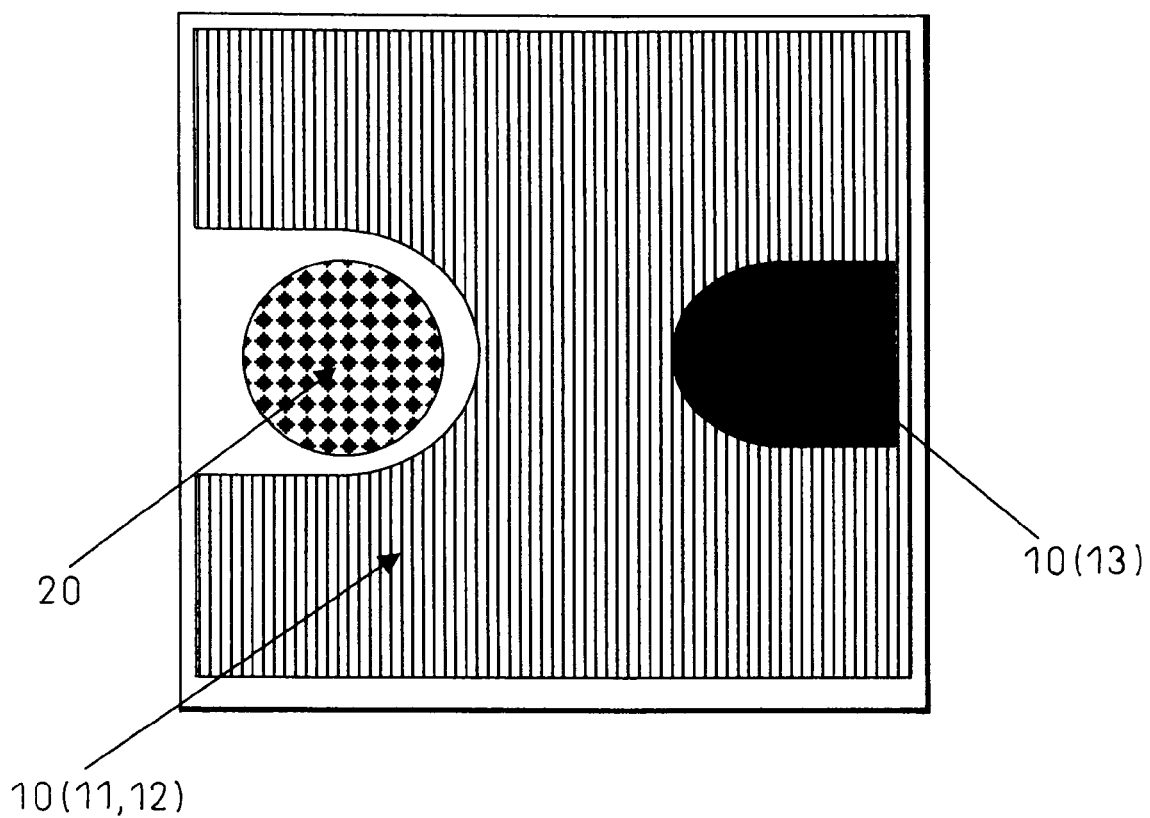

TRANSPARENT POSITIVE ELECTRODE

CROSS REFERENCE TO RELATED APPLICATION

This application is an application filed under 35 U.S.C. §111(a) claiming benefit, pursuant to 35 U.S.C. §119(e)(1), of the filing date of the Provisional Application No. 60/570,136 filed on May 12, 2004, pursuant to 35 U.S.C. §111(b).

TECHNICAL FIELD

The present invention relates to a transparent positive electrode and, more particularly, to a transparent positive electrode having an excellent transparency and an ohmic characteristic which is suitable for use in a gallium nitride-based compound semiconductor light-emitting device.

BACKGROUND ART

In recent years, GaN-based compound semiconductor materials have drawn attention as semiconductor materials for light-emitting devices which emit short-wavelength light. A GaN-based compound semiconductor is formed on any of a variety of oxide substrates such as a sapphire single crystal or a III-V Group compound substrate, through a metal organic chemical vapor deposition method (MOCVD method), a molecular beam epitaxy method (MBE method), or a similar method.

One characteristic of the GaN-based compound semiconductor material is that the current diffusing in the lateral direction is small. Although the phenomenon has not been completely elucidated, one conceivable reason is that the current diffusion is affected by a large number of dislocations propagating through the epitaxial crystal layers in a direction from a substrate to the top surface. In addition, as the electric resistance of a p-type GaN-based compound semiconductor is very high as compared with that of an n-type GaN-based compound semiconductor, when a metal is merely laminated on the p-type GaN-based compound semiconductor, a current is scarcely diffused in the lateral direction in the p-type GaN-based compound semiconductor. Therefore, when an LED structure having a p-n junction is formed of the GaN-based compound semiconductor, the light emission is limited to a region directly below the electrodes.

To solve this problem, electron beam irradiation or high-temperature annealing is applied to decrease the resistivity of p-type semiconductor layer and thereby intensify the diffusibility of current. However, the electron beam irradiation involves an unduly high production cost because the apparatus is very expensive. Also, uniform processing in the wafer plane is difficult to attain. In high-temperature annealing, a process at 900° C. or more is necessary for markedly bringing out the effect but, in this process, the crystal structure of GaN starts to decompose and the voltage property in the reverse direction may deteriorate due to desorption of nitrogen.

There has been also proposed a technique where Ni and Au, each on the order of tens of nm, are stacked as positive electrodes on the p-type semiconductor layer and alloyed in an oxygen atmosphere to accelerate the reduction of resistance of the p-type semiconductor layer and form a positive electrode having transparency and ohmic property (see, Japanese Patent No. 2,803,742).

However, alloying in an oxygen atmosphere brings about formation of an oxide layer on the exposed surface of n-type GaN layer and this layer affects the ohmic property of the negative electrode. Also, the Au/Ni electrode resulting from alloying in an oxygen atmosphere has a network structure and therefore, uneven light emission readily occurs or the mechanical strength is too low and the electrode requires covering with a protective layer, giving rise to high production cost. Furthermore, since Ni is heat-treated in an oxygen atmosphere, an oxide of Ni covers the surface and when a pad electrode is formed on the transparent electrode, the adhesive property thereof is poor and a sufficiently high bonding strength cannot be obtained.

There has been also proposed a technique where Pt is formed as the positive electrode and heat-treated in an oxygen-containing atmosphere to effect the reduction of resistance of a p-type semiconductor layer and the alloying at the same time (see, Japanese Unexamined Patent Publication (Kokai) No. 11-186605). However, this method also has the above-described problems because the heat treatment is performed in an oxygen atmosphere. Furthermore, the thickness of the Pt layer must be very small (5 nm or less) so as to provide a transparent electrode of Pt alone and, in turn, the Pt layer comes to have a high electric resistance. As a result, even when the resistance of the Pt layer is decreased by heat treatment, the current diffuses poorly and non-uniform light emission occurs, giving rise to elevation of forward voltage (VF) and reduction of emission intensity.

DISCLOSURE OF INVENTION

In order to solve these problems, an object of the present invention is to provide a positive electrode having high transparency, low contact resistance and excellent current diffusibility and not requiring electron beam irradiation, high-temperature annealing or heat treatment, for alloying, in an oxygen atmosphere. The transparency as used in the present invention means that the positive electrode is transparent to light in the wavelength region of 300 to 600 nm.

The present invention provides the following inventions.

(1) A transparent positive electrode for gallium nitride-based compound semiconductor light-emitting devices, comprising a contact metal layer in contact with a p-type semiconductor layer, a current diffusing layer on the contact metal layer, the current diffusing layer having an electrical conductivity larger than that of the contact metal layer, and a bonding pad layer on the current diffusing layer.

(2) The transparent positive electrode according to 1 above, wherein the contact metal layer is a platinum group metal or an alloy containing a platinum group metal.

(3) The transparent positive electrode according to 2 above, wherein the contact metal layer is platinum.

(4) The transparent positive electrode according to any one of 1 to 3 above, wherein the thickness of the contact metal layer is from 0.1 to 7.5 nm.

(5) The transparent positive electrode according to 4 above, wherein the thickness of the contact metal layer is from 0.1 to 5 nm.

(6) The transparent positive electrode according to 5 above, wherein the thickness of the contact metal layer is from 0.5 to 2.5 nm.

(7) The transparent positive electrode according to any one of 1 to 6 above, wherein the current diffusing layer is a metal selected from the group consisting of gold, silver and copper, or an alloy containing at least one member of gold, silver and copper.

(8) The transparent positive electrode according to 7 above, wherein the current diffusing layer is gold.

(9) The transparent positive electrode according to any one of 1 to 8 above, wherein the thickness of the current diffusing layer is from 1 to 20 nm.

(10) The transparent positive electrode according to 9 above, wherein the thickness of the current diffusing layer is from 1 to 10 nm.

(11) The transparent positive electrode according to 10 above, wherein the thickness of the current diffusing layer is from 3 to 6 nm.

(12) A gallium nitride-based compound semiconductor light-emitting device comprising the transparent positive electrode according to any one of 1 to 11 above.

The transparent positive electrode of the present invention, where a thin layer of a metal having a low contact resistance with a p-type GaN-based compound semiconductor, for example, a platinum group metal, is used as the contact metal layer and a current diffusing layer having an electrical conductivity larger than that of the contact metal layer is provided thereon, is improved in the diffusion of current in the plane direction of the positive electrode, so that a high-brightness light-emitting device capable of realizing a low forward voltage (VF value) and uniform light emission over the entire surface of the positive electrode can be produced.

BRIEF DESCRIPTION OF DRAWINGS

FIG. 3 a plan view showing a gallium nitride-based compound semiconductor light-emitting device fabricated in Example 1.

BEST MODES FOR CARRYING OUT THE INVENTION

Figure 1:
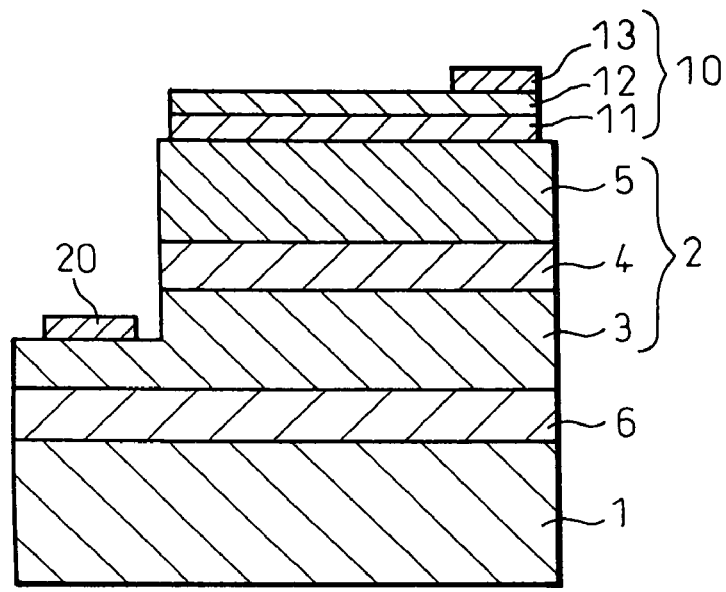
FIG. 1 is a schematic view showing a cross section of a light-emitting device having the transparent positive electrode of the present invention.

FIG. 1 is a schematic view showing a cross section of a light-emitting device having the transparent positive electrode of the present invention. The numeral 11 is a contact metal layer, 12 is a current diffusing layer, 13 is a bonding pad layer, and 11 to 13 constitute the transparent positive electrode 10 of the present invention. The numeral 1 is a substrate, and 2 is a GaN-based compound semiconductor which comprises an n-type semiconductor layer 3, a light-emitting layer 4 and a p-type semiconductor layer 5. The numeral 6 is a buffer layer and 20 is a negative electrode.

As for the performance required of the contact metal layer, it is essential that the contact resistance with the p-type semiconductor layer is small. Furthermore, in the case of a face-up-mount type light-emitting device of causing light from the light-emitting layer to emerge from the electrode surface side, excellent optical transparency is required.

In view of contact resistance with the p-type semiconductor layer, the material for the contact metal layer is preferably a platinum group metal such as platinum (Pt), ruthenium (Ru), osmium (Os), rhodium (Rh), iridium (Ir) and palladium (Pd), or an alloy containing a platinum group metal. Among these, Pt is preferred because the work function is high and good ohmic contact can be obtained by a non-heating process for a p-type GaN-based compound semiconductor layer which is not subjected to a high-temperature heat treatment and has a relatively high resistance.

When the contact metal layer is constituted by a platinum group metal or an alloy containing a platinum group metal, the thickness thereof must be very small from the standpoint of optical transparency. The thickness of the contact metal layer is preferably from 0.1 to 7.5 nm. If the thickness of the contact metal layer is less than 0.1 nm, a stabilized thin film can be hardly obtained, whereas if it exceeds 7.5 nm, the transparency decreases. The thickness is more preferably from 0.1 to 5 nm and when reduction of transparency due to later stacking of a current diffusing layer and stable film formation are taken account of, the thickness is still more preferably from 0.5 to 2.5 nm.

However, when the thickness of the contact metal layer is decreased, the contact metal layer comes to have high electric resistance in the plane direction and, owing to its synergistic effect with the p-type semiconductor layer having relatively high resistance, the current can diffuse only in the periphery of the pad layer as the current injection part and, as a result, the light emission pattern may become non-uniform to yield a reduced emission output.

In order to compensate for the current diffusibility of the contact metal layer, a current diffusing layer comprising a metal thin film having a high light transmittance and being more electrically conductive than the contact metal layer is disposed, whereby the current can be uniformly diffused without greatly impairing the low contact resistance property and light transmittance of the platinum group metal and in turn, a light-emitting device having a high light emission output can be obtained.

The material for the current diffusing layer is preferably a metal having a high electrical conductivity, for example, a metal selected from the group consisting of gold, silver and copper, or an alloy containing at least one member of gold, silver and copper. Among these, gold is most preferred because this metal assures a high light transmittance when formed into a thin film.

The thickness of the current diffusing layer is preferably from 1 to 20 nm. If the thickness is less than 1 nm, the effect of diffusing the current is not fully exerted, whereas if it exceeds 20 nm, the optical transparency of the current diffusing layer is seriously reduced and the light emission output may decrease. The thickness is more preferably from 1 to 10 nm. Furthermore, when the thickness is from 3 to 6 nm, the balance between the optical transparency of current diffusing layer and the effect of diffusing current is most satisfied and when combined with the contact metal layer, light is uniformly emitted over the entire surface on the positive electrode and at the same time, high-output light emission is obtained.

The method for the film formation of the contact metal layer or current diffusing layer is not particularly limited and a known vacuum deposition or sputtering method can be used. In the positive electrode produced by such a method, the constituent elements may be mutually diffused to provide an alloy state on the interface between the contact metal layer and the current diffusing layer and/or p-type semiconductor layer. The thickness of each layer may be non-uniform within the plane and even if there is fluctuation of about ±20%, this has almost no influence on the effect.

As for the bonding pad layer constituting the bonding pad part, various structures using various materials are known and these known structures can be used without any particular limitation. However, a material having good adhesive property with the current diffusing layer is preferred, and the thickness must be sufficiently large to prevent the contact metal layer or current diffusing layer from damaging due to stress at the bonding. The outermost layer is preferably constituted by a metal having good adhesive property with the bonding ball.

The transparent positive electrode of the present invention can be used without limitation for conventionally known gallium nitride-based compound semiconductor light-emitting devices where, as shown in FIG. 1, a gallium nitride-based compound semiconductor is stacked on a substrate through a buffer layer and, thereon, an n-type semiconductor layer, a light-emitting layer and a p-type semiconductor layer are formed.

No particular limitation is imposed on the material of the substrate, and the substrate may be formed of any known material. Examples of the known material include oxide single crystals such as sapphire single crystal ($Al_2O_3$; A-plane, C-plane, M-plane, or R-plane), spinel single crystal ($MgAl_2O_4$), ZnO single crystal, $LiAlO_2$ single crystal, $LiGaO_2$ single crystal, and MgO single crystal; Si single crystal; SiC single crystal; GaAs single crystal; AlN single crystal; GaN single crystal; and boride single crystals such as $ZrB_2$ single crystal. No particular limitation is imposed on the crystal plane orientation of the substrate. The substrate may be an on-axis substrate or a substrate having an off-angle.

As for the n-type semiconductor layer, light-emitting layer and p-type semiconductor layer, various structures are known and these known structures can be used without any limitation. In particular, although a general carrier concentration is used as the carrier concentration of the p-type semiconductor layer, the transparent positive electrode of the present invention can also be applied to a p-type semiconductor layer having a relatively lower carrier concentration of, for example, about $1 \times 10^{17}$ $cm^{-3}$.

Gallium nitride compound semiconductors represented by formula: $Al_xIn_yGa_{1-x-y}N$ ($0 \leq x<1$, $0 \leq y<1$, $0 \leq x+y<1$) are known to form these layers. In the present invention, no particular limitation is imposed on the type of the gallium nitride compound semiconductor for forming the n-type semiconductor layer, the light-emitting layer, and the p-type semiconductor layer, and conventionally known gallium nitride compound semiconductors represented by formula: $Al_xIn_yGa_{1-x-y}N$ ($0 \leq x<1$, $0 \leq y<1$, $0 \leq x+y<1$) may be employed.

No particular limitation is imposed on the method for growing these gallium nitride semiconductors, and there may be employed any known method for growing a Group III nitride semiconductor, such as MOCVD (metal-organic chemical vapor deposition), HVPE (hydride vapor phase epitaxy), or MBE (molecular beam epitaxy). From the viewpoints of layer thickness controllability and mass productivity, MOCVD is preferably employed. In the case of MOCVD, hydrogen ($H_2$) or nitrogen ($N_2$) is employed as a carrier gas, trimethylgallium (TMG) or triethylgallium (TEG) is employed as a Ga (Group III element) source, trimethylaluminum (TMA) or triethylaluminum (TEA) is employed as an Al (Group III element) source, trimethylindium (TMI) or triethylindium (TEI) is employed as an In (Group III element) source, and ammonia ($NH_3$), hydrazine ($N_2H_4$), or the like is employed as an N (Group V element) source. In addition, monosilane ($SiH_4$) or disilane ($Si_2H_6$) serving as an Si source, or germane ($GeH_4$) serving as a Ge source is employed as an n-type dopant, whereas bis(cyclopentadienyl)magnesium ($Cp_2Mg$) or bis(ethylcyclopentadienyl)magnesium (($EtCp)_2Mg$) serving as an Mg source is employed as a p-type dopant.

In the gallium nitride-based compound semiconductor obtained by sequentially stacking an n-type semiconductor layer, a light-emitting layer and a p-type semiconductor layer on a substrate, the light-emitting layer and p-type semiconductor layer are partially removed to expose the n-type semiconductor layer so that a negative electrode can be formed in contact with the n-type semiconductor layer. Thereafter, the transparent positive electrode of the present invention is formed on the remaining p-type semiconductor layer, and a negative electrode is formed on the exposed n-type semiconductor layer. As for the negative electrode, negative electrodes having various compositions and structures are known and these known negative electrodes can be used without any limitation.

EXAMPLES

The present invention will next be described in more detail by way of examples, which should not be construed as limiting the invention thereto.

Example 1

Figure 2:
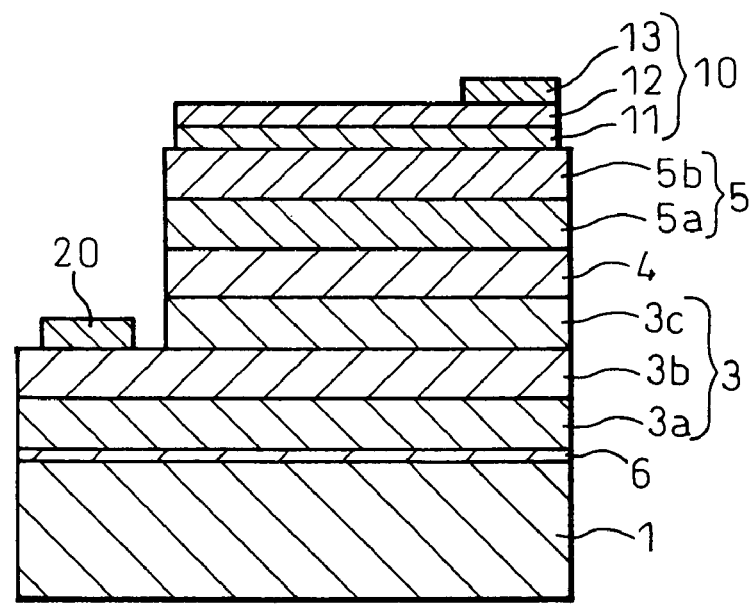
FIG. 2 is a cross-sectional view showing a gallium nitride-based compound semiconductor light-emitting device fabricated in Example 1.

FIG. 2 is a schematic view of a cross-section of the gallium nitride compound semiconductor light-emitting device fabricated in Example 1, and FIG. 3 is a schematic plan view of it. An AlN buffer layer (6) was formed on a sapphire substrate (1). A gallium nitride compound semiconductor stacked structure was fabricated by sequentially forming the following layers on the buffer layer: an undoped GaN base layer (thickness: 3 μm) (3a); an Si-doped n-type GaN contact layer (thickness: 2 μm) (3b); an n-type $In_{0.1}Ga_{0.9}N$ cladding layer (thickness: 0.03 μm) (3c); a light-emitting layer (4) of a multiple quantum well structure including Si-doped GaN barrier layers (5 layers and one final layer, each thickness: 0.03 μm) and $In_{0.20}Ga_{0.80}N$ well layers (5 layers, each thickness: 2.5 nm); an Mg-doped p-type $Al_{0.07}Ga_{0.93}N$ cladding layer (thickness: 0.05 μm) (5a); and an Mg-doped p-type GaN contact layer (thickness: 0.15 μm) (5b). On the p-type GaN contact layer of the gallium nitride compound semiconductor stacked structure, the inventive positive electrode (10) having a contact metal layer composed of Pt (thickness: 1.5 nm) (11), a current diffusing layer composed of Au (thickness: 5 nm) (12) and a bonding pad layer having five-layer structure consisting of Au/Ti/Al/Ti/Au (each thickness: 50/20/10/100/200 nm) (13) was formed. Then, on the n-type GaN contact layer, a negative electrode (20) having a double-layer structure consisting of Ti/Au was formed. The semiconductor side of the thus-fabricated light-emitting device serves as a light-extraction side. FIG. 3 shows the configuration of the positive electrode and the negative electrode.

In the above stacked structure, the n-type GaN contact layer had a carrier concentration of $1 \times 10^{19}$ $cm^{-3}$, the GaN barrier layer had an Si dopant concentration of $1 \times 10^{18}$ $cm^{-3}$, the p-type GaN contact layer had a carrier concentration of $5 \times 10^{18}$ $cm^{-3}$, and the p-type AlGaN cladding layer had an Mg dopant concentration of $5 \times 10^{19}$ $cm^{-3}$.

These gallium nitride compound semiconductor layers (3~6 in FIG. 2) were stacked through MOCVD under well-known typical conditions. The positive electrode and the negative electrode were formed through the following procedure.

At the beginning, a portion of the n-type GaN contact layer on which the negative electrode was to be provided was exposed by means of reactive ion etching through the following procedure.

Firstly, an etching mask was formed on the p-type semiconductor layer. The etching mask was formed through the following procedure. A photoresist was applied on the entire surface of the semiconductor stacked structure, and a portion of the resist, which portion was an area for forming the positive electrode, was removed through a known photolithographic technique. The thus-treated stacked structure was placed in a vacuum vapor deposition apparatus, and Ni (thickness: about 50 nm) and Ti (thickness: about 300 nm) were stacked through the electron-beam method at $4 \times 10^{-4}$ Pa or lower. Subsequently, the stacked metal film along with the resist was removed, from the area other than the positive electrode area, through lift-off technique.

Then, on an electrode set in an etching chamber of the reactive ion etching apparatus, the semiconductor stacked structure was placed. The etching chamber was evacuated to $10^{-4}$ Pa, and etching gas ($Cl_2$) was fed to the evacuated chamber. Etching was performed until the n-type GaN contact layer was exposed. After completion of etching, the structure was removed from the reactive ion etching apparatus, and the etching mask was removed with nitric acid and hydrofluoric acid.

Through a known photolithography technique and lift-off technique, a contact metal layer composed of Pt and a current diffusing layer composed of Au were formed exclusively on an area of the p-type GaN contact layer for forming the positive electrode. The contact metal layer and the current diffusing layer were formed by placing the gallium nitride compound semiconductor stacked structure in a sputtering apparatus and, on the p-type GaN contact layer, successively sputtering Pt (1.5 nm) and Au (5 nm) in this order. After removal of the stacked structure from the vacuum chamber, the stacked structure was treated through a so-called known lift-off technique. Furthermore, through the same technique, a first layer composed of Au, a second layer composed of Ti, a third layer composed of Al, a forth layer composed of Ti and a fifth layer composed of Au was formed on a portion of the current diffusing layer in this order so as to form a bonding pad layer. Thus the inventive positive electrode was formed on the p-type GaN contact layer.

The thus-fabricated positive electrode exhibited transparency and the light transmittance was 60% at the wavelength of 470 nm. The light transmittance was measured by the spectrophotometer using a sample which was formed by stacking the same contact metal layer and current diffusing layer abovementioned on a glass plate. The value of the light transmittance was calculated taking a control, in which only the glass plate was measured, into consideration.

Subsequently, on the exposed n-type GaN contact layer, the negative electrode was formed through the following procedure. Firstly, a resist was applied to the entire surface of the structure, and a portion of the resist, which portion was an area for forming the negative electrode on the exposed n-type GaN contact layer, was removed through a known photolithographic technique. Through conventionally employed vacuum vapor deposition, Ti (100 nm) and Au (200 nm) were sequentially deposited on the semiconductor layer, to thereby form a negative electrode. Thereafter, the resist was removed through a routine method.

The back of the substrate of the thus-formed wafer having the positive electrode and the negative electrode was ground and polished, to thereby adjust the substrate thickness to 80 μm, followed by scribing the wafer on the semiconductor-stacked layer side by use of a laser scriber, and cutting through the chip-division lines, to thereby produce square chips (350 μm×350 μm). The forward voltage of respective chips at an applied current of 20 mA was found to be 2.9 V through measurement by means of a probe.

The chip was mounted in a TO-18 package can. The emission output of the chip at an applied current of 20 mA was found to be 4 mW through measurement by means of a tester and it was observed that the chip emitted light over the entire surface of the positive electrode.

Comparative Example 1

The procedure of Example 1 was repeated, except that the current diffusing layer was not formed, to thereby fabricate a gallium nitride-based compound semiconductor light-emitting device.

The thus-produced light-emitting device was evaluated in a manner similar to that of Example 1, and the forward voltage and the emission output were found to be 3.1 V and 3.7 mW. A light emission on the positive electrode was limited on the periphery of the bonding pad layer and of the line which lead to the negative electrode from the bonding pad layer. It is presumed that the contact metal layer had high electric resistance in the plane direction and the current could not diffuse.

Comparative Example 2

The procedure of Example 1 was repeated, except that the current diffusing layer was not formed and the contact metal layer had a thickness of 12 nm, to thereby fabricate a gallium nitride-based compound semiconductor light-emitting device.

The thus-produced light-emitting device was evaluated in a manner similar to that of Example 1, and the forward voltage and the emission output were found to be 2.9 V and 3.0 mW. It was observed that the chip emitted light over the entire surface of the positive electrode similarly to Example 1. However, the light transmittance was lowered to 30% and, as a result, the emission output was lowered.

INDUSTRIAL APPLICABILITY

The electrode of the present invention for use in a gallium nitride-based compound semiconductor light-emitting device is useful as a transparent positive electrode of a gallium nitride-based compound semiconductor light-emitting device.

The invention claimed is:

1. A gallium nitride-based compound semiconductor light-emitting device comprising a transparent positive electrode having a contact metal layer in contact with a p-type semiconductor layer, a current diffusing layer on the contact metal layer, the current diffusing layer having an electrical conductivity larger than that of the contact metal layer, and a bonding pad layer on the current diffusing layer, wherein the thickness of the contact metal layer is from 0.1 to 7.5 nm.

2. The gallium nitride-based compound semiconductor light-emitting device according to claim 1, wherein the contact metal layer is a platinum group metal or an alloy containing a platinum group metal.

3. The gallium nitride-based compound semiconductor light-emitting device according to claim 2, wherein the contact metal layer is platinum.

4. The gallium nitride-based compound semiconductor light-emitting device according to claim 1, wherein the thickness of the contact metal layer is from 0.1 to 5 nm.

5. The gallium nitride-based compound semiconductor light-emitting device according to claim 4, wherein the thickness of the contact metal layer is from 0.5 to 2.5 nm.

6. The gallium nitride-based compound semiconductor light-emitting device according to claim 1 wherein the current diffusing layer is a metal selected from the group consisting of gold, silver and copper, or an alloy containing at least one member of gold, silver and copper.

7. The gallium nitride-based compound semiconductor light-emitting device according to claim 6, wherein the current diffusing layer is gold.

8. The gallium nitride-based compound semiconductor light-emitting device according to claim 1, wherein the thickness of the current diffusing layer is from 1 to 20 nm.

9. The gallium nitride-based compound semiconductor light-emitting device according to claim 8, wherein the thickness of the current diffusing layer is from 1 to 10 nm.

10. The gallium nitride-based compound semiconductor light-emitting device according to claim 9, wherein the thickness of the current diffusing layer is from 3 to 6 nm.

* * * * *